United States Patent
Kim

(10) Patent No.: US 6,753,193 B2
(45) Date of Patent: Jun. 22, 2004

(54) METHOD OF FABRICATING FERROELECTRIC MEMORY DEVICE

(75) Inventor: Hyun-Ho Kim, Kyunggi-do (KR)

(73) Assignee: Samsung Electronics Co., Ltd., Suwon (KR)

(*) Notice: Subject to any disclaimer, the term of this patent is extended or adjusted under 35 U.S.C. 154(b) by 0 days.

(21) Appl. No.: 10/621,851

(22) Filed: Jul. 16, 2003

(65) Prior Publication Data

US 2004/0014248 A1 Jan. 22, 2004

Related U.S. Application Data

(62) Division of application No. 10/004,505, filed on Oct. 30, 2001, now Pat. No. 6,617,628.

(30) Foreign Application Priority Data

Nov. 21, 2000 (KR) .......................................... 2000-69282

(51) Int. Cl.[7] .............................................. H01G 7/06
(52) U.S. Cl. ............................ 438/3; 438/240; 438/238
(58) Field of Search ...................... 438/3, 240, 250–256, 438/381, 393–399; 257/295–312

(56) References Cited

U.S. PATENT DOCUMENTS

| | | |
|---|---|---|
| 5,138,412 A | 8/1992 | Hieda et al. |
| 5,335,138 A | 8/1994 | Sandhu et al. |
| 5,903,492 A | 5/1999 | Takashima |
| 6,284,588 B1 * | 9/2001 | Yu .............................. 438/240 |

* cited by examiner

Primary Examiner—H. Jey Tsai
(74) Attorney, Agent, or Firm—Marger Johnson & McCollom, P.C.

(57) ABSTRACT

A ferroelectric memory device having a multi-layer electrode structure and a fabricating method thereof are described. The ferroelectric memory device includes a semiconductor substrate having first and second transistors, an interlayer insulating layer covering the first and second transistors, and first and second ferroelectric capacitor sequentially stacked on the interlayer insulating layer. The first ferroelectric capacitor includes a lower electrode, a first ferroelectric layer, and a middle electrode sequentially stacked on the interlayer insulating layer, while the second ferroelectric capacitor includes the middle electrode, and a second ferroelectric layer and an upper electrode sequentially stacked on the middle electrode. First and second transistors are selectively connected to the first and second ferroelectric capacitors, respectively, forming two or one unit cell. Therefore, it is possible to form a unit cell in a smaller area than a conventional area, and increase an area that a capacitor occupies.

15 Claims, 7 Drawing Sheets

METHOD OF FABRICATING FERROELECTRIC MEMORY DEVICE

This application is a divisional of U.S. patent application Ser. No. 10/004,505 filed on Oct. 30, 2001, now U.S. Pat. No. 6,617,628 which is herein incorporated by reference in it's entirety.

FIELD OF THE INVENTION

The present invention generally relates to a semiconductor device and a method of fabricating the semiconductor device. More specifically, the present invention is directed to a ferroelectric memory device and a method of fabricating the ferroelectric memory device.

BACKGROUND OF THE INVENTION

A ferroelectric memory device is a non-volatile memory device in which data can be stored even when power to the device is turned off. Similar to a dynamic random access memory (DRAM), a unit cell of the ferroelectric memory device is composed of one transistor and one capacitor. With an operating speed similar to that of a DRAM, the ferroelectric memory device can be highly integrated. Therefore, the ferroelectric memory device has been regarded as a next-generation non-volatile memory device.

A ferroelectric layer is used as a dielectric layer of a capacitor to achieve non-volatility in a ferroelectric memory device. The ferroelectric layer has a polarization hysteresis characteristic such that a polarity is maintained, even after a polarizing electric field has been removed.

Conventionally, a ferroelectric capacitor is composed of a lower electrode, a ferroelectric layer, and an upper layer, which are sequentially stacked. As integration levels of semiconductor devices increase, the ferroelectric capacitor must exhibit without requiring more area on the semiconductor device.

Various manners have been suggested to achieve higher capacitance. For example, a ferroelectric material having a higher polarization value is used, or the effective area of a capacitor is increased. One proposed to fabricate a three-dimensional (e.g., cylindrical or trench-shaped) capacitor. But a deposition method for forming an electrode or dielectric layer having a three-dimensional shape is not developed yet.

Therefore, the present invention is aimed at solving the foregoing problems and its object is to provide a ferroelectric memory device which can maximize the capacitance of a capacitor.

Another object of the present invention is to provide a ferroelectric memory device, which can enhance an integration level.

Still another object of the present invention is to provide a method of fabricating the above ferroelectric memory device.

SUMMARY OF THE INVENTION

To accomplish these and other objects of the present invention, a ferroelectric memory device includes first and second switching elements formed on a semiconductor substrate, an interlayer insulating layer formed on a resulting structure where the first and second switching elements are formed, and first and second ferroelectric capacitors, sequentially stacked on the interlayer insulating layer, each having at least three electrode layers. The first ferroelectric capacitor includes a lower electrode formed on the interlayer insulating layer, a first ferroelectric layer formed on the lower electrode, and a middle electrode formed on the first ferroelectric layer. The second ferroelectric capacitor includes the middle electrode, a second ferroelectric layer formed on the middle electrode, and an upper electrode formed on the second ferroelectric layer.

The first and second switching elements are first and second MOS transistors, respectively. In one embodiment, the lower electrode is electrically connected to a source region of the first MOS transistor. The upper electrode is electrically connected to a source region of the second MOS transistor, and further includes a plate line coupled to the middle electrode. Alternatively, the middle electrode is electrically connected to one of the source regions of the first and second MOS transistors, and further includes first and second plate lines that are coupled to the lower and upper electrodes, respectively. Alternatively, the lower and upper electrodes are electrically connected to one of the source regions of the first and second MOS transistors, and include a plate line coupled to the middle electrode.

According to a first aspect of the present invention, there is provided a method of fabricating a ferroelectric memory device. First and second switching elements are formed on a semiconductor substrate. An interlayer insulating layer is formed to cover the first and second switching elements. First and second contact plugs, which are respectively connected to the first and second switching elements, are formed in the interlayer insulating layer. On the interlayer insulating layer, a capacitor is formed wherein a lower electrode coupled to the first contact plug, a first ferroelectric layer, a middle electrode, a second ferroelectric layer, and an upper electrode are sequentially stacked. An insulating layer is formed to cover the capacitor, the second contact plug, and the interlayer insulating layer. In the insulating layer, an interconnection is formed to connect the second contact plug to the upper electrode. Further, a plate line coupled to the middle electrode is formed in the insulating layer.

According to a second aspect of the present invention, there is provided a method of fabricating a ferroelectric memory device. A switching element is formed on a semiconductor substrate. An interlayer insulating layer is formed to cover the switching element. A contact plug coupled to the switching element is formed in the interlayer insulating layer. On the interlayer insulating layer, a capacitor is formed wherein a lower electrode, a first ferroelectric layer, a middle electrode, a second ferroelectric layer, an upper electrode are sequentially stacked. An insulating layer is formed to cover the capacitor, the contact plug, and the interlayer insulating layer. In the insulating layer, an interconnection is formed to connect the contact plug to the middle electrode.

According to a third aspect of the present invention, there is provided a method of fabricating a ferroelectric memory device. A switching element is formed on a semiconductor substrate. An interlayer insulating layer is formed to cover the switching element. A contact plug coupled to the switching element is formed in the interlayer insulating layer. On the interlayer insulating layer, a capacitor is formed wherein a lower electrode coupled to the contact plug, a first ferroelectric layer, a middle electrode, a second ferroelectric layer, and an upper electrode are sequentially stacked. An insulating layer is formed to cover the capacitor and the interlayer insulating layer. In the insulating layer, an interconnection is formed to connect the lower electrode to the upper electrode. Further, a plate line coupled to the middle electrode is formed in the insulating layer.

A further understanding of the nature and advantage of the invention herein may be realized by reference to the remaining portions of the specification and the attached drawings.

DESCRIPTION OF THE PREFERRED EMBODIMENT

Figure 1A:
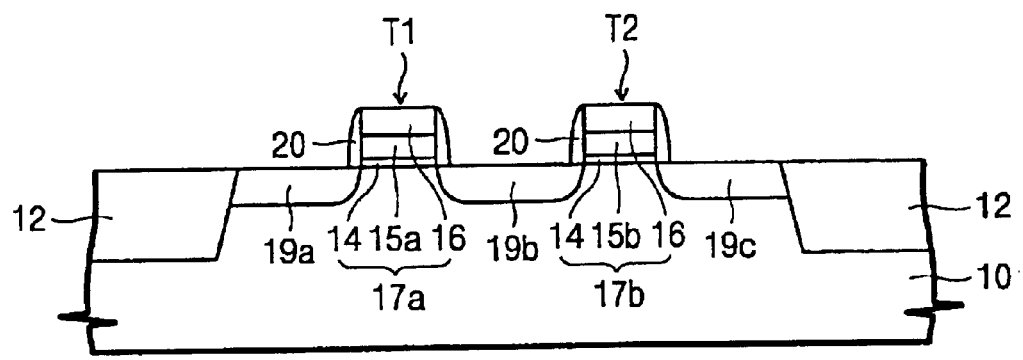
FIG. 1A though FIG. 1D are cross-sectional views for explaining a method of fabricating a ferroelectric memory device in accordance with a first embodiment of the present invention.

A new and improved ferroelectric memory device and a fabricating method thereof will now be described more fully hereinafter with reference to the accompanying drawings.

Now, a structure of a ferroelectric memory device according to the first embodiment of the invention will be described with reference to FIG. 1D. A device isolation layer 12 is formed in a predetermined area of a semiconductor substrate 10 to define an active region. A pair of gate patterns, which are parallel with each other, i.e., first and second gate patterns 17a and 17b are formed on the top surface of the active region. A common drain region 19b is formed at an active region between the first and second gate patterns 17a and 17b. First and second source regions 19a and 19c are formed at active regions on at both sides of, and separated from the common drain region 19b, respectively. The first gate pattern 17a includes a gate oxide layer 14, a first gate electrode 15a, and a gate capping layer 16 that are sequentially stacked. Similarly, the second gate pattern 17b includes a gate oxide layer 14, a second gate electrode 15b, and a gate capping layer 16 that are sequentially stacked. The first and second gate electrodes 15a and 15b correspond to first and second wordlines, respectively. Sidewalls of the patterns 17a and 17b can be covered with spacers 20. The first gate pattern 17a, the common drain region 19b, and the first source region 19a compose a first switching element T1, i.e., a first MOS transistor. And, the second gate pattern 17b, the common drain region 19b, and the second source region 19c compose a second switching element T2, i.e., a second MOS transistor.

A resulting structure including the first and second switching elements T1 and T2 is covered with a first interlayer insulating layer 22. A bitline 25 is located on the first interlayer insulating layer 22, and is electrically connected to the common drain region 19b through a hole penetrating a predetermined area of the first interlayer insulating layer 22. The bitline 25 and the first interlayer insulating layer 22 are covered with a second interlayer insulating layer 27. The first and second interlayer insulating layers 22 and 27 composes an interlayer insulating layer. The first source region 19a is electrically connected to a first contact plug 30a penetrating the interlayer insulating layer. And, the second source region 19c is electrically connected to a second contact plug 30b penetrating the interlayer insulating layer.

First and second ferroelectric capacitors CF1 and CF2 are sequentially stacked on a predetermined area of the interlayer insulating layer. The capacitors CF1 and CF2 include at least three electrode layers. The first ferroelectric capacitor CF1 includes a lower electrode 35, a first ferroelectric layer 36, and a middle electrode 37 that are sequentially stacked. And, the second ferroelectric capacitor CF2 includes the middle electrode 37, and a second ferroelectric layer 38 and an upper electrode 39 that are sequentially stacked on the middle electrode 37. The lower electrode 35 is contacted with a first contact plug 30a, while the upper electrode 39 is electrically connected to the second contact plug 30b. And, the middle electrode 37 is electrically connected to a plate line 47. As a result, the first ferroelectric capacitor CF1 is electrically connected to the first switching element T1, i.e., the first source region 19a, while the second ferroelectric capacitor CF2 is electrically connected to the second switching element T2, i.e., the second source region 19c.

Now, a method of fabricating a ferroelectric memory device according to the first embodiment of the invention will be described hereinafter.

Referring to FIG. 1A, a device isolation layer 12 is formed on a semiconductor substrate 10 to define an active region. The device isolation layer 12 is formed using, for example, a local oxidation of silicon (LOCOS) technique or a trench device isolation technique. On the active region of the semiconductor substrate 10, first and second gate patterns 17a and 17b are formed wherein a gate oxide layer 14, gate electrodes 15a and 15b, and a gate capping layer 16 are sequentially stacked. The first gate pattern 17a is composed of a gate oxide layer 14, a first gate electrode 15a, and a gate capping layer 16. The second gate pattern is composed of a gate oxide layer 14, a second gate electrode 15b, and a gate capping layer 16. In this case, the first and second electrodes 15a and 15b correspond to first and second wordlines, respectively. Each of the electrodes 15a and 15b is composed of a multi-layer where, for example, a doped polysilicon layer and a tungsten silicide layer are sequentially stacked. The gate capping layer 16 is made of, for example, silicon oxide or silicon nitride.

Conductive impurity ions are implanted into an active region at both sides of the first and second gate patterns 17a and 17b, forming a first source region 19a, a common drain region 19b, and a second source region 19c. An insulating layer (e.g., a silicon nitride layer) for forming a spacer is formed on a resulting structure where the source/drain regions 19a, 19b, and 19c are formed. Then, the insulating layer is anisotropically etched to form a spacer 20 on sidewalls of the gate patterns 17a and 17b. This leads to completion of a first switching element T1 (i.e., a first MOS transistor) and a second switching element T2 (i.e., a second MOS transistor). The first switching element T1 is composed of the first gate pattern 17a, the first source region 19a, and the common drain region 19b. And, the second switching element T2 is composed of the second gate pattern 17b, the second source region 19c, and the common drain region 19b.

Figure 1B:
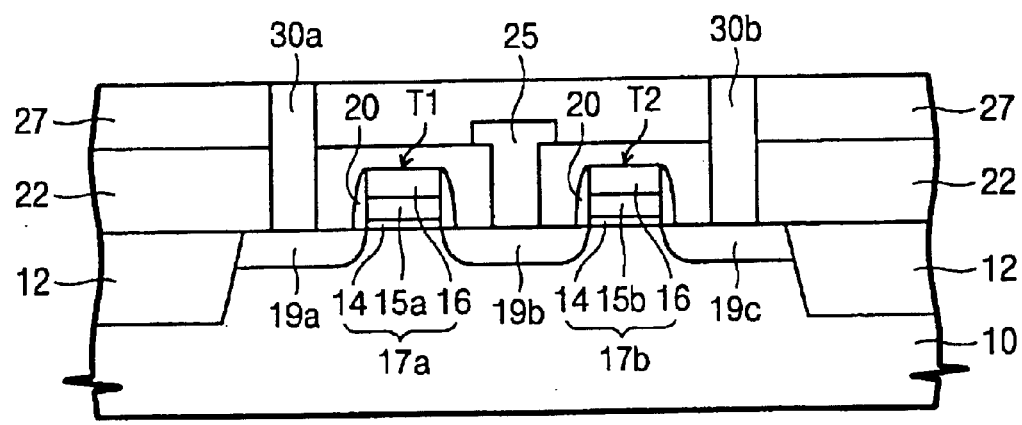

Referring now to FIG. 1B, a first interlayer insulating layer 22 is formed on an entire surface of a semiconductor substrate 10 including first and second MOS transistors. The first interlayer insulating layer 22 is patterned to form a bitline contact hole that exposes a part a common drain region 19b. A conductive layer to fill a contact hole is formed on an entire surface of a resulting structure where bitline contact holes are formed. The conductive layer is then patterned to form a bitline 25 that is electrically connected to the common drain region 19b.

A second interlayer insulating layer 27 is formed on the first interlayer insulating layer 22 including the bitline 25. The second and first interlayer insulating layers 27 and 22 are sequentially patterned to form storage node contact holes that expose a part of first and second source regions 19a and 19c. A conductive layer (e.g., a polysilicon layer) to fill a storage node contact hole is formed on an entire surface of a resulting structure where the storage node contact holes are formed. Using a chemical mechanical polishing (CMP) technique, the conductive layer is planarly etched to form a first contact plug 30a coupled to the first source region 19a and a second contact plug 30b coupled to the second source region 19b.

Figure 1C:
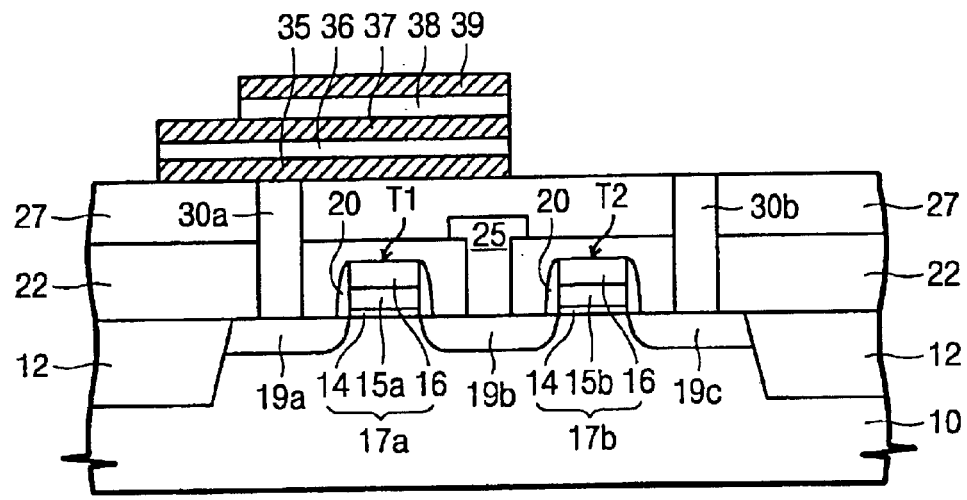

Referring now to FIG. 1C, as a feature of the present invention, one stack capacitor is formed and shared by two unit cells. A lower capacitor electrode layer 35 is formed on a second interlayer insulating layer 27, which includes first and second contact plugs 30a and 30b. The lower electrode layer 35 is made of, for example, platinum, iridium oxide, ruthenium oxide, and LaSrCo oxide (LSCO). Preferably, the lower electrode layer 35 is formed by sequentially stacking a titanium layer, a titanium nitride layer, an iridium layer, an iridium oxide layer, and a platinum layer. The lower capacitor electrode layer 35 is formed of such a multi-layer, which is aimed at enhancing an interface characteristic between the lower electrode layer 35 and the first contact plug 30a, reliability of the lower electrode layer 35, a retention characteristic, and a fatigue characteristic.

As a capacitor dielectric layer, a first ferroelectric layer 36 is formed on the lower electrode layer 35. A middle electrode layer 37 and a second ferroelectric layer 38 are sequentially formed on the first dielectric layer 36. The first and second ferroelectric layer 36 and 38 are made of, for example, lead zirconia titanate (PZT), lead lanthanum zirconia titanate (PLZT), strontium barium titanate (SBT), and barium lanthanum titanate (BLT). And, the ferroelectric layer 36 and 38 are formed using one of sol-gel spin coating, sputtering, and chemical vapor deposition (CVD) manners. The middle electrode layer 37 is made one selected from a group consisting of platinum, iridium oxide, ruthenium oxide, and LaSrCo oxide (LSCO).

Using a rapid thermal process (RTP) manner, a heat treatment of 700° C. and more is performed to a resulting structure where the second ferroelectric layer 38 is formed. So the first and second ferroelectric layer 36 and 38 are crystallized with perovskite or lamellar structure, having a ferroelectric character. An upper electrode layer 39 is then formed on the second ferroelectric capacitor layer 38. The upper electrode layer 39 is made of one selected from a group consisting of platinum, iridium oxide, ruthenium oxide, and LaSrCo oxide (LSCO).

After patterning the upper electrode 39 and the second ferroelectric layer 38, the middle electrode layer 37, the first ferroelectric layer 38, and the lower electrode layer 35 are patterned to form a stack capacitor having a multi-layer electrode structure. In this case, the lower electrode layer 35 is patterned so that it can be coupled to the first contact plug 30a and cannot be coupled to the second contact plug 30b. As a result, a stack capacitor having a lower electrode 35 coupled to a source region of the first transistor T1 is formed.

Depending upon a capacitor shape, a patterning process to form the stack capacitor may be performed according to the steps, as follows. A lower electrode layer 35, a first ferroelectric layer 36, and a middle electrode layer 37 are sequentially formed on a second interlayer insulating layer 27. The middle insulating layer 27, the first ferroelectric layer 36, and the lower electrode layer 35 are sequentially patterned for coupling the lower electrode layer 35 to a first contact plug 30a. After sequentially depositing a second ferroelectric layer 38 and an upper electrode layer 39 on an entire surface of the patterned resulting structure, the upper electrode 39 and the second ferroelectric layer 38 are sequentially patterned to complete a stack capacitor.

Compared with a conventional capacitor that is composed of a lower electrode, a ferroelectric capacitor, and an upper electrode, the foregoing capacitor has a multi-layer electrode structure where at least three electrodes, i.e., a lower electrode 35, a first ferroelectric layer 36, a middle electrode 37, a second ferroelectric layer 38, and an upper electrode 39 are sequentially stacked.

Figure 1D:
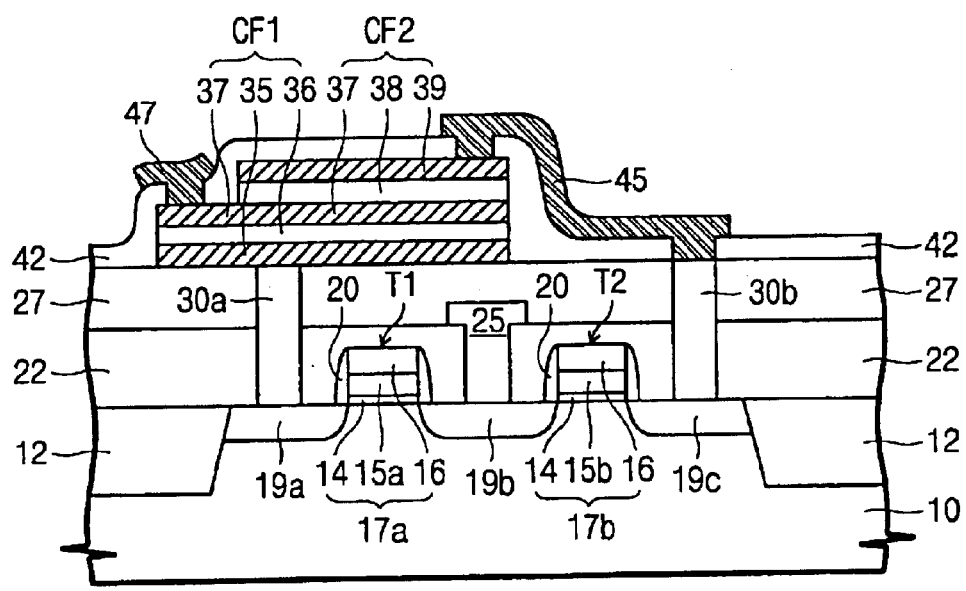

Referring now to FIG. 1D, an insulating layer 42 is formed on an entire surface of a resulting structure where a stack capacitor is formed. The insulating layer 42 is made of one selected from a group consisting of, for example, phosphosilicate glass (PSG), undoped silicate glass (USG), and plasma enhanced tetraethylorthosilicate (PE-TEOS). Then, the insulating layer 42 is patterned to contact holes that expose a middle electrode layer 37, a predetermined area of an upper electrode layer 39, a second contact plug 30b. A conductive layer (e.g., an aluminum layer) to fill a contact hole is formed on the insulating layer 42 including the contact holes. The conductive layer is patterned to form a metal interconnection 45 that electrically connects the second contact plug 30b to the upper electrode layer 39, and a plate line 47 that is electrically connected to the middle electrode layer 37.

Figure 2:
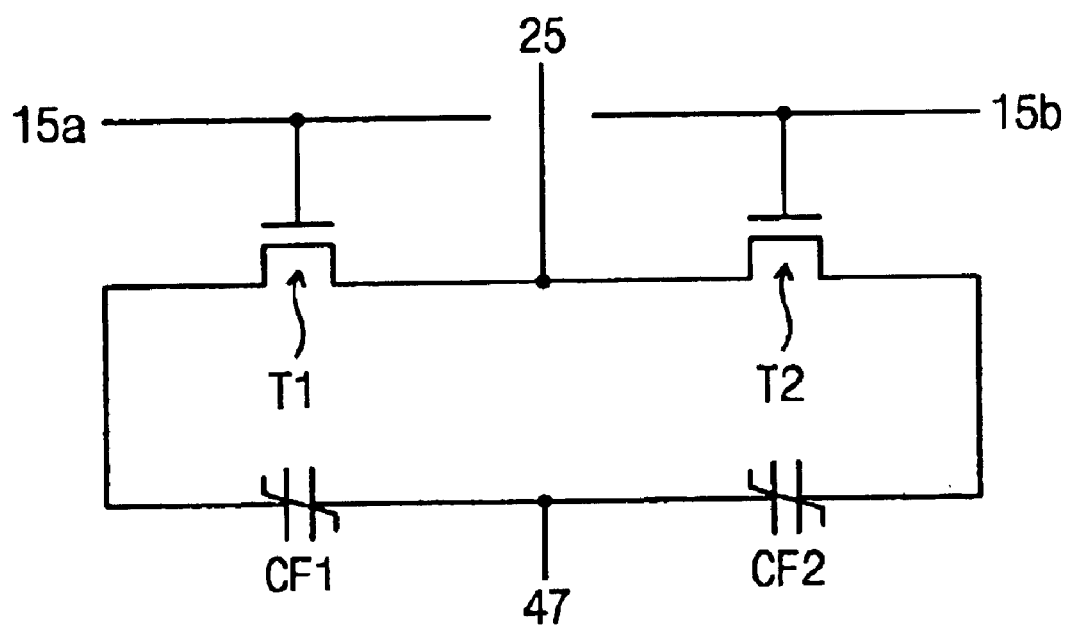
FIG. 2 is an equivalent circuit diagram to a ferroelectric memory cell in accordance with a first embodiment of the present invention.

Thus, the lower capacitor electrode 35 is coupled to a source region 19a of a first transistor, while the upper capacitor electrode 39 is coupled to a source region 19c of a second transistor. As a result, two unit cells sharing one plate line 47 are formed, as shown in FIG. 2. In other words, the lower electrode layer 35, the first ferroelectric layer 36, and the middle electrode layer 37 composes a first ferroelectric capacitor CF1 that is coupled to the first transistor. And, the upper electrode layer 39, the second ferroelectric layer 38, and the middle electrode layer 36 compose a second ferroelectric capacitor CF2 that is coupled to the second transistor. The overlapped ferroelectric capacitors CF1 and CF2 are formed in a plane area that two unit cells occupy, maximizing a capacitance of each ferroelectric capacitor.

Figure 3A:
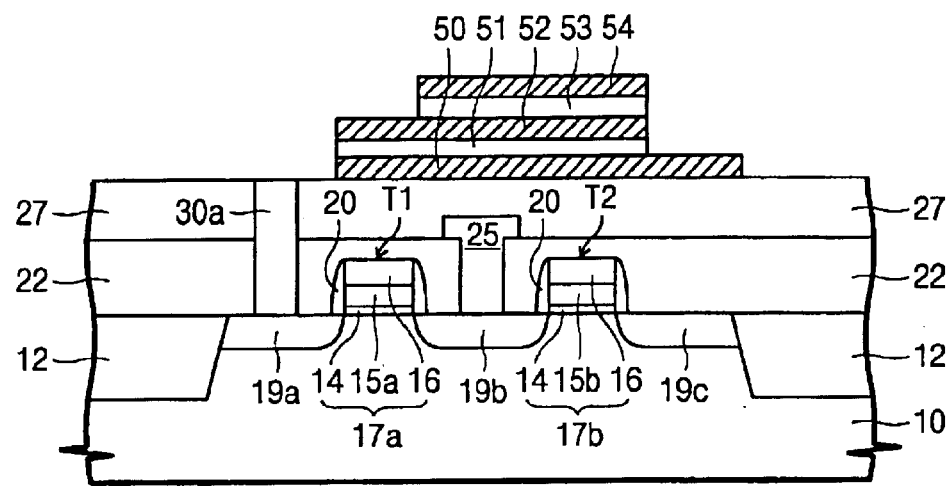
FIG. 3A and FIG. 3B are cross-sectional views for explaining a method of fabricating a ferroelectric memory device in accordance with a second embodiment of the present invention.
Figure 3B:
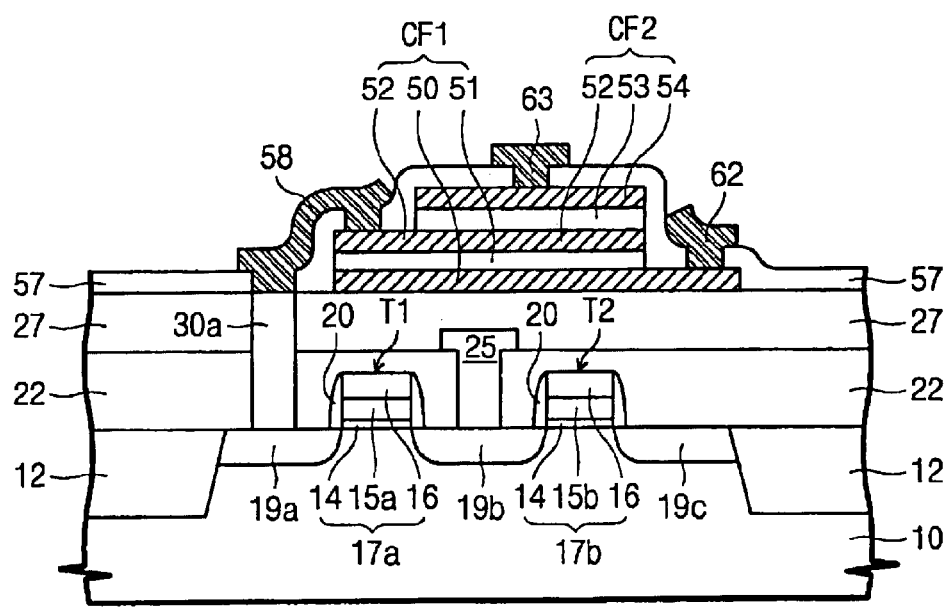
Figure 4:
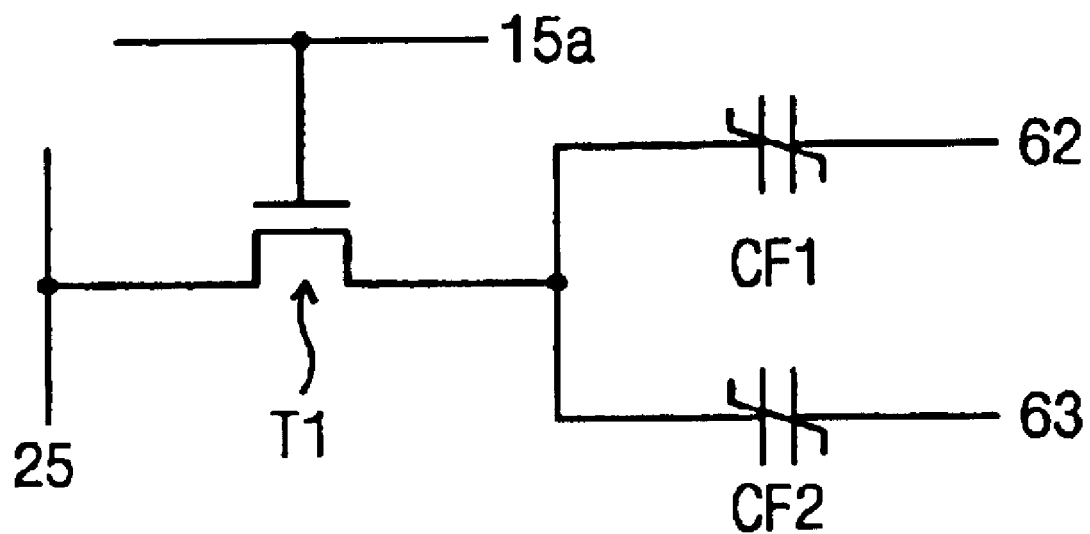
FIG. 4 is an equivalent circuit diagram to a ferroelectric memory cell in accordance with a second embodiment of the present invention.

Cross-sectional views for explaining a method of fabricating a ferroelectric memory device according to a second embodiment of the invention are shown in FIG. 3A and FIG. 3B. An equivalent circuit diagram to a ferroelectric memory device fabricated by the second embodiment is shown in FIG. 4.

With reference to FIG. 3B, a construction of a ferroelectric memory device fabricated by the second embodiment will now be described more fully hereinafter. In FIG. 3B, similar to the first embodiment, first and second switching elements T1 and T2, interlayer insulating layers 22 and 27, a bitline 25, and a first contact plug 30a are formed. First and second ferroelectric capacitors CF1 and CF2, which are sequentially stacked on a predetermined area of an interlayer insulating layer, include at least three electrode layers. The first ferroelectric capacitor CF1 includes a lower electrode 50, a first ferroelectric layer 51, and a middle electrode 52 that are sequentially stacked. The second ferroelectric capacitor CF2 includes the middle electrode 52, and a second ferroelectric layer 53 and an upper electrode 54 that are sequentially stacked on the middle electrode 52. In this case, the middle electrode 52 is coupled to the first contact plug 30a. The lower electrode 50 is electrically connected to a first plate line 62. The upper electrode 54 is electrically coupled to a second plate line 63. Consequently, the capacitors CF1 and CF2, which are coupled in parallel, are connected to the first switching element T1, i.e., first source region 19a. And, the first ferroelectric capacitor CF1 is connected to the first plate line 62 while the second ferroelectric capacitor CF2 is connected to the second plate line 63.

The method of fabricating a ferroelectric memory device according to the second embodiment will be described more fully.

In FIG. 3A, similar to the first embodiment, a switching element T1, a bitline 25, and a contact plug 30a are formed. A lower electrode layer 50, a first ferroelectric layer 51, a middle electrode layer 52, a second ferroelectric layer 53, and an upper electrode layer 54 are sequentially formed on a second interlayer insulating layer 27 including a first contact plug 30a. The upper electrode layer 54, the second ferroelectric layer 53, the middle electrode 52, the first ferroelectric layer 51, and the lower electrode layer 50 are patterned to form a stack capacitor. In this case, the lower capacitor electrode layer 50 is patterned so that it cannot be coupled to the first contact plug 30a.

Depending upon a shape of a stack capacitor, a patterning process may be performed according to the steps, as follows. A lower electrode layer 50 is formed on a second interlayer insulating layer 27 including a contact plug 30a. The lower electrode layer 50 is patterned so that it cannot be coupled to the contact plug 30a. A first ferroelectric capacitor layer 51 and a middle electrode layer 52 are sequentially formed on the second interlayer insulating layer 27 including the lower electrode layer 50. After patterning the middle electrode layer 52 and the ferroelectric layer 51, a second ferroelectric layer 53 and an upper electrode layer 54 are sequentially formed. The upper electrode layer 54 and the second ferroelectric layer 53 are then patterned to complete a stack capacitor.

Referring to FIG. 3B, an insulating layer 57 is formed on an entire surface of a resulting structure where a stack capacitor is formed. The insulating layer 57 is then patterned to form a contact holes for an interconnection and contact holes for a plate line. The contact holes for an interconnection expose a predetermined area of a middle electrode layer 52 and a contact plug 30a, while the contact holes for a plate line expose a lower electrode layer 50 and a predetermined area of an upper electrode layer 54. Then, a conductive layer (e.g., an aluminum layer) to fill a contact hole is formed on an entire surface of the resulting structure where the contact holes are formed. The conductive layer is patterned to form a metal interconnection 58 for electrically connecting the contact plug 30a to the middle electrode layer 52, a first plate line 62 coupled to the lower electrode layer 50, and a second plate line 63 coupled to the upper electrode layer 54.

As a result, the middle electrode layer 52 of a capacitor is connected to a source region 19a of a transistor. Also, the lower and upper electrode layers 50 and 54 are coupled to the first and second plate lines 62 and 63, respectively. Therefore, a unit cell composed of one transistor and two capacitors is formed, as shown in FIG. 4. In other words, the middle electrode layer 52, a first ferroelectric layer 51, and the lower electrode layer 50 compose a first ferroelectric capacitor CF1. Also, the middle electrode layer 52, a second ferroelectric layer 53, and the upper electrode layer 54 compose a second ferroelectric capacitor CF2. Since the capacitors CF1 and CF2 are coupled to respective first and second plate lines 62 and 63, each unit cell serves as a memory cell for storing respective data. Consequently, a stack capacitor where one transistor is overlapped with first and second ferroelectric capacitors is formed to compose two unit cells. It is therefore possible to form a unit cell in a smaller area than a conventional area, and increase a plane area that a capacitor occupies.

Figure 5A:
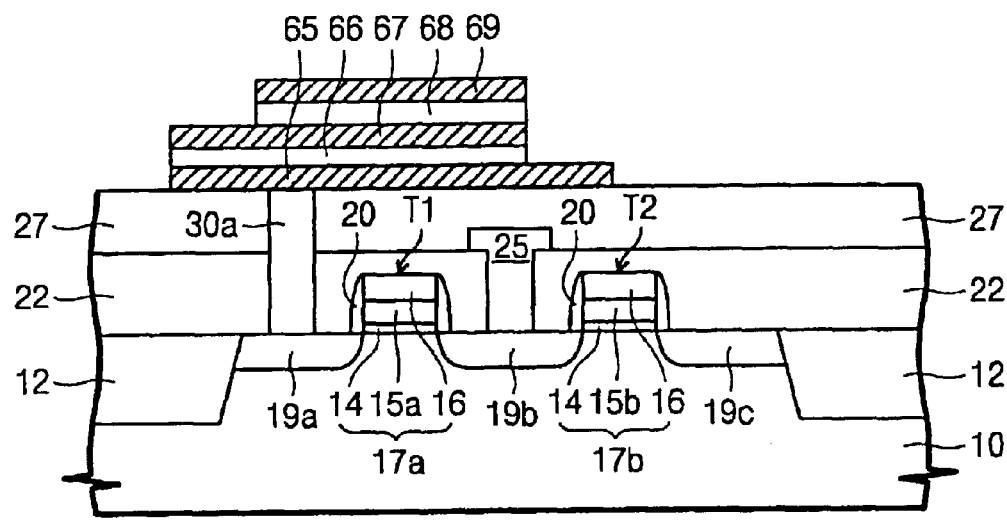
FIG. 5A and FIG. 5B are cross-sectional views for explaining a method of fabricating a ferroelectric memory device in accordance with a third embodiment of the present invention.
Figure 5B:
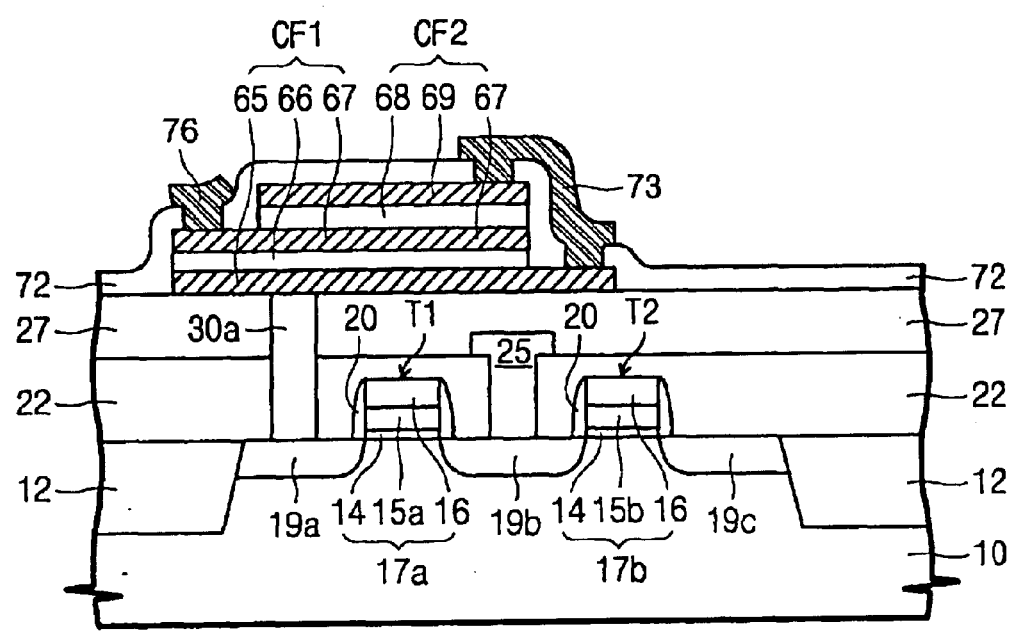
Figure 6:
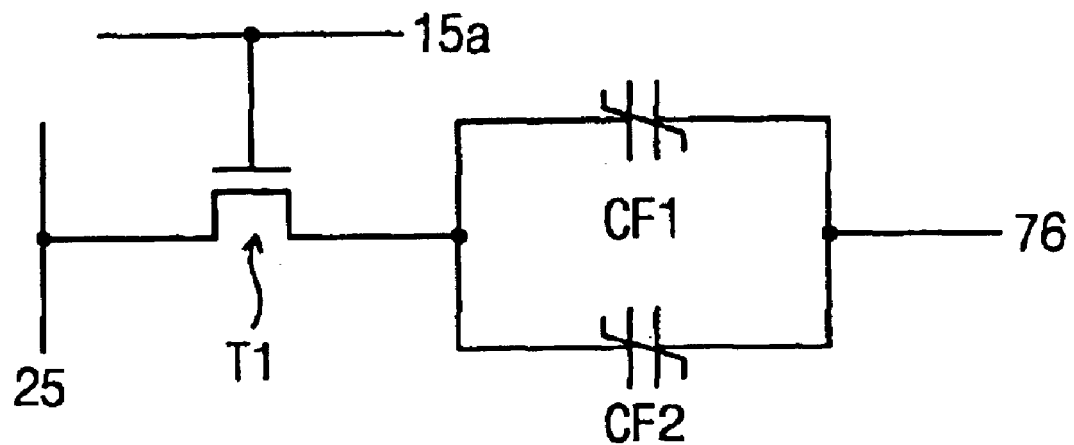
FIG. 6 is an equivalent circuit diagram to a ferroelectric memory cell in accordance with a third embodiment of the present invention.

Cross-sectional views for explaining a method of fabricating a ferroelectric capacitor according to a third embodiment of the present invention are shown in FIG. 5A and FIG. 5B. And, an equivalent circuit diagram to a ferroelectric memory device according to the third embodiment is shown in FIG. 6.

With reference to FIG. 5B, a construction of the ferroelectric memory device according to the third embodiment will now be described more fully hereinafter.

In FIG. 5B, similar to the first embodiment, first and second switching elements T1 and T2, interlayer insulating layers 22 and 27, a bitline 25, and a first contact plug 30a are formed. First and second capacitors CF1 and CF2 are sequentially formed on a predetermined area of an interlayer insulating layer. The capacitors CF1 and CF2 include at least three electrode layers. The first capacitor CF1 includes a lower electrode 65, a first ferroelectric layer 66, and a middle electrode 67 that are sequentially stacked. And, the second capacitor CF2 includes the middle electrode 67, and a second ferroelectric layer 67 and an upper electrode 69 that are sequentially stacked on the middle electrode 67. The lower electrode 65 is coupled to the first contact plug 30a. The upper electrode 69 is electrically coupled to the lower electrode 65. And, the middle electrode 67 is coupled to a plate line 76. So the capacitors CF1 and CF2, which are coupled in parallel, are coupled to the first switching element T1 (i.e., a first source region 19a) and a common plate line 76.

The method of fabricating a ferroelectric memory device according to the third embodiment will now be described more fully.

In FIG. 5A, a transistor T1, a bitline 25, and a contact plug 30a are formed using a manner same as the first embodiment. A lower electrode layer 65, a first ferroelectric layer 66, a middle electrode layer 67, a second ferroelectric layer 68, and an upper electrode layer 69 are sequentially formed on a second interlayer insulating layer 27 including the contact plug 30a. The upper electrode layer 69, the second ferroelectric layer 68, the middle electrode layer 67, the first ferroelectric layer 66, and the lower electrode layer 65 are patterned to a stack capacitor. The lower electrode layer 65 of the stack capacitor is formed on the contact plug 30a, being electrically coupled to a source region 19a of a transistor.

In FIG. 5B, an insulating layer 72 is formed on an entire surface of a resulting structure where a stack capacitor is formed. The insulating layer 72 is then patterned to contact holes for an interconnection and contact holes a plate line. The contact holes for an interconnection expose predetermined areas of lower and upper electrode layers 65 and 69, while the contact holes for a plate line expose a predetermined area of a middle electrode layer 67. A conductive layer (e.g., an aluminum layer) to fill a contact hole is formed on an entire surface of a resulting structure where the contact holes are formed. The conductive layer is patterned to form a metal interconnection 73 for electrically connecting the lower electrode layer 65 to the upper electrode layer 69, and a plate line 76 electrically connected to the middle electrode layer 67.

As a result, the lower electrode layer 65 is connected to the upper electrode layer 69 while the middle electrode layer 67 is coupled to the plate line 76. This leads to formation of a unit cell where two capacitors are coupled to one transistor T1 in parallel, as shown in FIG. 6. In other words, the lower electrode layer 65, the first ferroelectric layer 66, and the middle electrode layer 67 composes a first ferroelectric capacitor CF1. Also, the electrode layer 69, the second ferroelectric layer 68, and the middle electrode layer 67 compose a second ferroelectric capacitor CF2. A stack capacitor where the capacitors CF1 and CF2 are overlapped with each other is formed to maximize a capacitance of the capacitor. As described above, since a stack capacitor has a multi-layer electrode structure having at least three electrode layers, a capacitance of the capacitor can be maximized. In a plane area that one a unit cell occupies, two unit cells are formed to increase an integration level.

What is claimed is:

1. A method of fabricating a ferroelectric memory device comprising the steps of:

forming first and second switching elements on a semiconductor substrate;

forming an interlayer insulating layer covering the first and second switching elements;

forming first and second contact plugs in the interlayer insulating layer, the first and second contact plugs being coupled to the first and second switching elements, respectively;

forming, on the interlayer insulating layer, capacitors where a lower electrode coupled to the first contact plug, a first ferroelectric layer, a middle electrode, a second ferroelectric layer, and an upper electrode are sequentially stacked;

forming an insulating layer covering the capacitor, the second contact plug, and the interlayer insulating layer; and forming, in the insulating layer, an interconnection for connecting the second contact plug to the upper electrode.

2. The method of claim 1 further comprising a step of forming a plate line coupled to the middle electrode in the insulating layer.

3. The method of claim 1, wherein the lower, middle, and the upper electrodes are made of one selected from a group consisting of platinum, iridium oxide, ruthenium oxide, and LaSrCo oxide (LSCO), respectively.

4. The method of claim 3, wherein the lower electrode is formed of a multi-layer comprising a titanium layer, a titanium nitride layer, an iridium layer, an iridium oxide layer, and a platinum layer sequentially stacked.

5. The method of claim 1, wherein the ferroelectric layer is made of one selected from a group consisting of lead zirconia titanate (PZT), lead lanthanum zirconia titanate (PLZT), strontium barium titanate (SBT), and barium lanthanum titanate (BLT).

6. A method of fabricating a ferroelectric memory device comprising the steps of:

forming a switching element on a semiconductor substrate;

forming an interlayer insulating layer covering the switching element;

forming a contact plug coupled to the switching element in the interlayer insulating layer;

forming, on the interlayer insulating layer, first and second capacitors comprising a lower electrode, a first ferroelectric layer, a middle electrode, a second ferroelectric layer, and an upper electrode;

forming an insulating layer covering the first and second capacitors, the contact plug, and the interlayer insulating layer; and forming an interconnection for connecting the contact plug to the middle electrode in the insulating layer.

7. The method of claim 6 further comprising a step of forming, in the insulating layer, a first plate line coupled to the lower electrode and a second plate line coupled to the upper electrode.

8. The method of claim 6, wherein the lower, middle, and the upper electrodes are made of one selected from a group consisting of platinum, iridium oxide, ruthenium oxide, and LaSrCo oxide (LSCO), respectively.

9. The method of claim 8, wherein the lower electrode is formed of a multi-layer comprising a titanium layer, a titanium nitride layer, an iridium layer, an iridium oxide layer, and a platinum layer sequentially stacked.

10. The method of claim 6, wherein the ferroelectric layer is made of one selected from a group consisting of lead zirconia titanate (PZT), lead lanthanum zirconia titanate (PLZT), strontium barium titanate (SBT), and barium lanthanum titanate (BLT).

11. A method of fabricating a ferroelectric memory device comprising the steps of:

forming a switching element on a semiconductor substrate;

forming an interlayer insulating layer covering the switching element;

forming a contact plug coupled to the switching element in the interlayer insulating layer;

forming, on the interlayer insulating layer, first and second capacitors comprising a lower electrode coupled to the contact plug, a first ferroelectric layer, a middle electrode, a second ferroelectric layer, and an upper electrode sequentially stacked;

forming an insulating layer covering the first and second capacitors and the interlayer insulating layer; and forming an interconnection for connecting the lower electrode to the upper electrode in the insulating layer.

12. The method of claim 11 further comprising a step of forming a plate line coupled to the middle layer in the insulating layer.

13. The method of claim 11, wherein the lower, middle, and the upper electrodes are made of one selected from a group consisting of platinum, iridium oxide, ruthenium oxide, and LaSrCo oxide (LSCO), respectively.

14. The method of claim 13, wherein the lower electrode is formed of a multi-layer comprising a titanium layer, a titanium nitride layer, an iridium layer, an iridium oxide layer, and a platinum layer sequentially stacked.

15. The method of claim 11, wherein the ferroelectric layer is made of one selected from a group consisting of lead zirconia titanate (PZT), lead lanthanum zirconia titanate (PLZT), strontium barium titanate (SBT), and barium lanthanum titanate (BLT).

* * * * *